United States Patent
Wei

(10) Patent No.: US 6,266,245 B1
(45) Date of Patent: Jul. 24, 2001

(54) HEAT DISSIPATION FIXTURE SEATING STRUCTURE

(76) Inventor: Wen-Chen Wei, P.O. Box No. 6-57, Chung-Ho City, Taipei Hsien 235 (TW)

( * ) Notice: Subject to any disclaimer, the term of this patent is extended or adjusted under 35 U.S.C. 154(b) by 0 days.

(21) Appl. No.: 09/472,905

(22) Filed: Dec. 27, 1999

(30) Foreign Application Priority Data

Sep. 30, 1999 (TW) .................................................. 88216499

(51) Int. Cl.$^7$ ..................................................... H05K 7/20
(52) U.S. Cl. ........................ 361/704; 165/80.3; 165/185; 174/16.3; 257/718; 257/719; 361/715
(58) Field of Search ................. 165/86.2, 86.3, 165/185; 174/16.3; 248/505, 510; 257/706–707, 712–713, 718–719, 726–727; 361/704, 697, 707, 709–710, 715, 717–718, 722

(56) References Cited

U.S. PATENT DOCUMENTS

| | | | | |
|---|---|---|---|---|
| 5,870,288 | * | 2/1999 | Chen | 361/704 |
| 5,903,434 | * | 5/1999 | Chiou | 361/704 |
| 5,932,925 | * | 8/1999 | McIntyre | 257/719 |
| 5,979,025 | * | 11/1999 | Horng | 361/704 |
| 6,025,994 | * | 2/2000 | Chiou | 361/727 |
| 6,049,457 | * | 4/2000 | Lee | 361/704 |

* cited by examiner

Primary Examiner—Gregory Thompson
(74) Attorney, Agent, or Firm—Dougherty & Troxell

(57) ABSTRACT

A heat dissipation fixture seating structure consisting of mounting components that mount a heat dissipation fixture onto a computer central processing unit (CPU), with the mounting componentry of the invention herein comprised of a holddown component and a lifter link component. The holddown component has a catch seat at one end and limiter sections are formed in the catch seat. A hook seat is situated at the other end and slots are formed in the hook seat. Additionally, inward facing latch hooks are formed at the two bottom ends of the holddown component. The lifter link component has a vertically surfaced adjustment saddle at one end; a threaded hole is tapped into the adjustment saddle and forked adjustment arms extend in parallel from its two sides, with a curved shank hook formed at the bottom end of each adjustment arm. The curved shank hooks engage into the slots of the hook seat, while the opposite extent of the forked adjustment arms fit into and are retained in position by the limiter sections. Then, a screw is utilized to tension the adjustment saddle, causing the catch seat and the hook seat to clamp inward and, subsequently, the inward clasping of the latch hooks, thereby achieving a tightly seated union with the CPU. Since loosening the same screw also enables removal, both installation and removal are simple and convenient.

2 Claims, 9 Drawing Sheets

HEAT DISSIPATION FIXTURE SEATING STRUCTURE

BACKGROUND OF THE INVENTION

1) Field of the Invention

The invention herein relates to a heat dissipation fixture seating structure for installing a heat dissipation fixture onto a computer central processing unit (CPU) that provides mounting componentry capable of assembly and disassembly from the exterior of the heat sink, thereby enabling easy installation and removal, while facilitating seating and adjustment.

2) Description of the Prior Art

To reduce heat generated by computer central processing units (CPU), personal computers currently have heat dissipation fixtures or devices installed over the CPU to maintain computer operating stability. Due to the continuous development of high performance integrated circuits and the miniaturization of chip dimensions, CPU manufacturers utilize modular designs that directly enclose the CPU in a hollow housing having fastening holes which provide for both heat dissipation and mounting. However, as indicated in FIG. 1, the conventional mounting structure for assembling the heat dissipation fixture to the CPU utilizes a clip component 1 and mounting posts 2 to attach the heat sink 3 to the CPU housing 4, wherein the said clip component 1 is horizontally straddled over the heat sink 3, with the hooked sections 11 at each of the two ends engaged in the fastening holes 41 of the CPU housing 4. The conical snap sections 21 at the lower end of the mounting posts 2 are inserted into both the through-holes of the heat sink 3 and the fastening holes 41 of the CPU housing 4, utilizing the rebound compression action of the conical snap sections 21 to attach the heat sink 3 to the top of the CPU housing 4. In such mounting structures, since the clip component 1 is straddled on the heat sink 3, the structure of which consists of vertically arrayed fins, the height of these elements constrain the application of force during installation and removal, which is especially so while undertaking removal because of the resilient anti-compressive nature of the conical snap sections 21 that tend to increase removal difficulty. To further facilitate assembly and installation, certain manufacturers have consequently developed an active mounting method of improved design which, as indicated in FIG. 2, consists of a movable rod 6 and tensile clips 7 configured onto the heat sink 5, wherein inward curved retaining sections 71 are formed on the ends of the tensile clips 7 and tabs 61 are disposed on the movable rod 6 to counter the elastic flexion of the tensile clips 7, thereby enabling the retaining sections 71 to securely hold the heat sink 5 on the CPU housing 8. Although this type of mounting structure supports easier assembly, since the movable rod 6 is a manually adjustable component and, furthermore, protrudes from exterior side of the heat dissipation fixture, it is subject to becoming loosened or dislodged if impacted during the assembly process, which sometimes results in having to assemble the unit twice and increases the degree of difficulty involved.

SUMMARY OF THE INVENTION

In view of the mounting structure drawbacks of the conventional heat dissipation fixtures that lead to numerous installation and removal inconveniences, the present invention is based on years of related experience and features an improved mounting structure that addresses the above drawbacks. In the invention herein, the horizontal section of the holddown component is held flush against the heat sink base plate, one end extends upward from the horizontal section at an angle and is then bent downward vertically, with a tensile catch seat formed at the bend. Notch-like limiter sections are formed in level juxtaposition on the two edges situated vertically below the catch seat, and an inward facing latch hook is formed at the bottom end of the catch seat, while the other end extends upward from the horizontal section at an angle. This physically narrower end is then bent downward vertically, a tensile hook seat is formed at the bend, a pair of slots are disposed in parallel in the hook seat, and an inward facing latch hook is formed at the bottom of the hook seat; also assembled to the holddown component is a lifter link component. The lifter link component is U-shaped and has an adjustment saddle vertically formed on one end. A threaded hole is tapped in the adjustment saddle and forked adjustment arms extend in parallel from the two sides. A reinforcing section is formed along the center extent of the forked adjustment arms, and a curved shank hook is formed at the bottom ends. When assembled, the adjustment saddle is situated against the outer side of the catch seat, the body of the forked adjustment arms are inserted and positioned in the limiter sections, and the curved shank hooks at the bottom end are engaged in the slots of the hook seat, at which time a space remains between the adjustment saddle and the catch seat. When a screw is fastened into the threaded hole of the adjustment saddle, the screw moves through the threaded hole as it is rotated and is brought against the catch seat; if the screw is tightened, due to the tensile action of the curved shank hooks, the catch seat and the hook slots move inward simultaneously, causing the latch hooks to clasp inwardly against the interior lateral edge of the through-holes of the CPU housing, with the resultant upward supporting force produced utilized to achieve a tightly seated union between the base plate and the CPU housing, thereby precluding vibration-induced loosening and movement. Since the adjustment saddle and the catch seat are in a vertically oriented configuration, after the heat dissipation fixture assembly is completed, they are positioned at the opening in the exterior side of the upper cover. As such, when removing, it is only necessary to loosen the screw in the opposite direction through the opening in the exterior side of the heat dissipation fixture, which requires a gentle application of force and, furthermore, installation is also simple and convenient.

The primary objective of the invention herein is to provide a heat dissipation fixture seating structure, wherein the seating structure is comprised of a holddown component and a lifter link component. The holddown component has a catch seat, at one end of which are formed limiter sections that position and retain the adjustment arms of the lifter link component. A hook seat is situated at the other end and slots are formed in the hook seat to provide for the engagement of curved shank hooks at the end of the adjustment arms. A screw in the threaded hole of the adjustment saddle is accessible from the exterior side of the heat sink and can be tightened against the catch seat to cause the catch seat and the hook seat to move inwardly, followed by the inward clasping of the latch hooks at their two ends to thereby achieve tight union with the CPU.

To enable a further understanding of the overall innovative structure of the present invention, the brief description of the drawings below are following the detailed description of the invention.

DETAILED DESCRIPTION OF THE INVENTION

Figure 1:
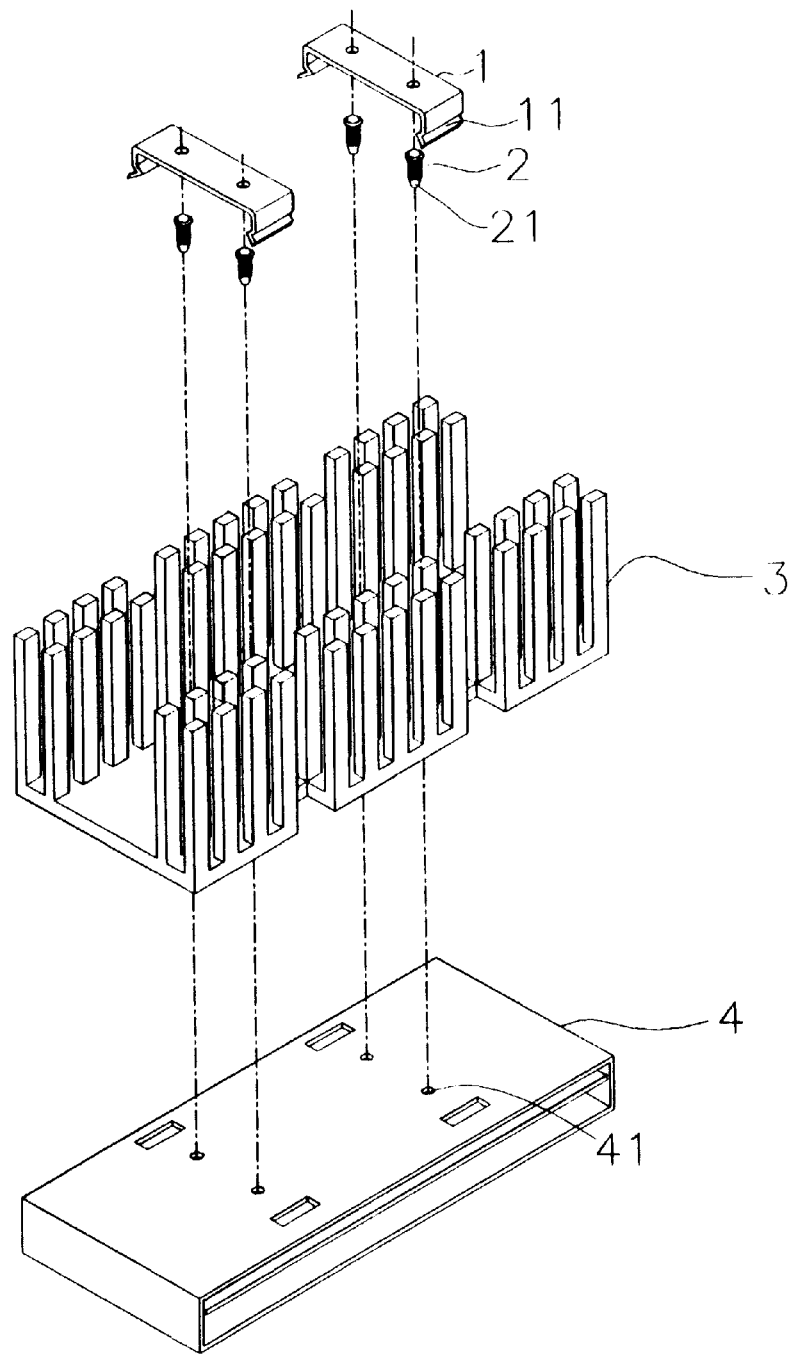
FIG. 1 is an exploded drawing of a conventional mounting structure.
Figure 2:
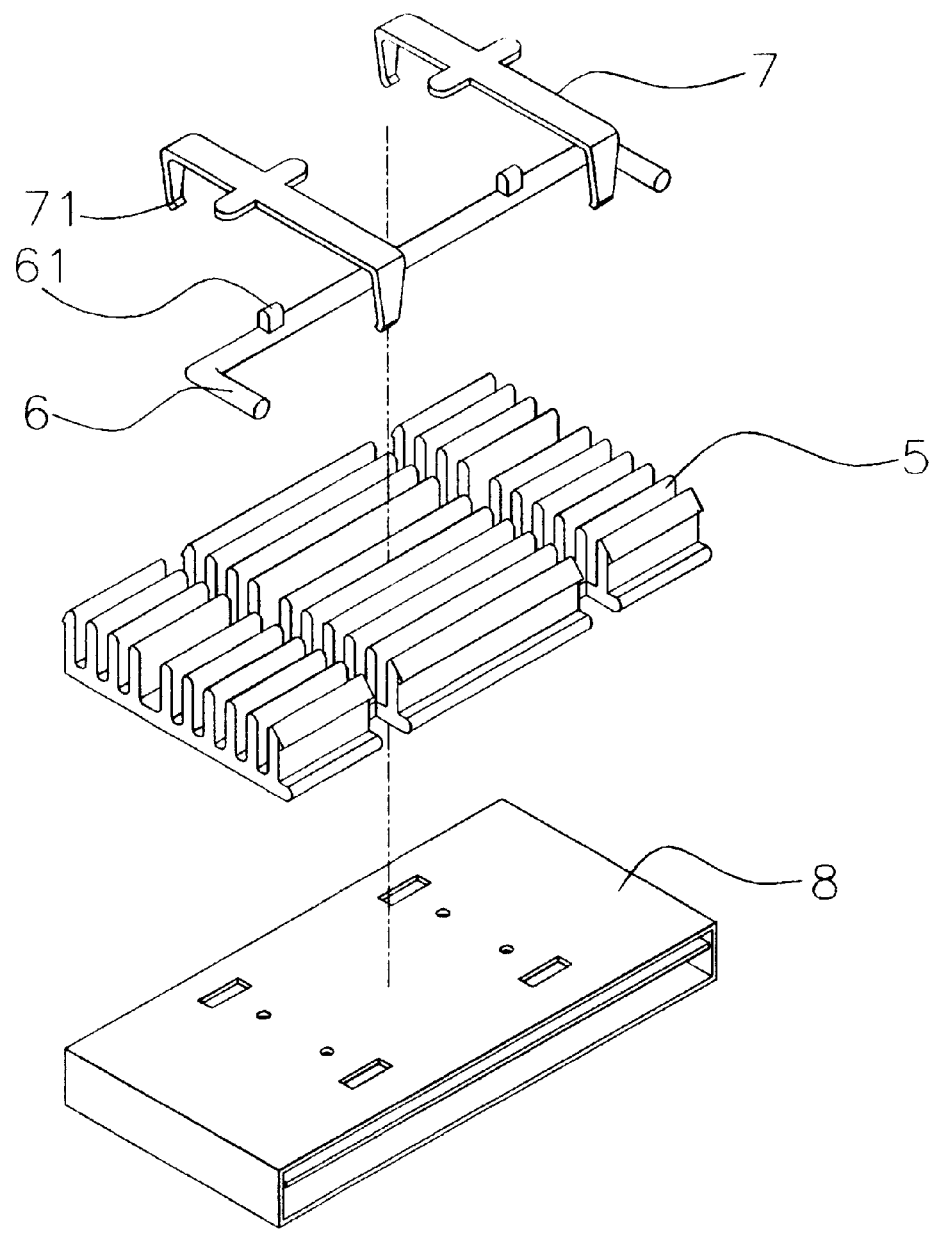
FIG. 2 is an exploded drawing of another conventional mounting structure.
Figure 3:
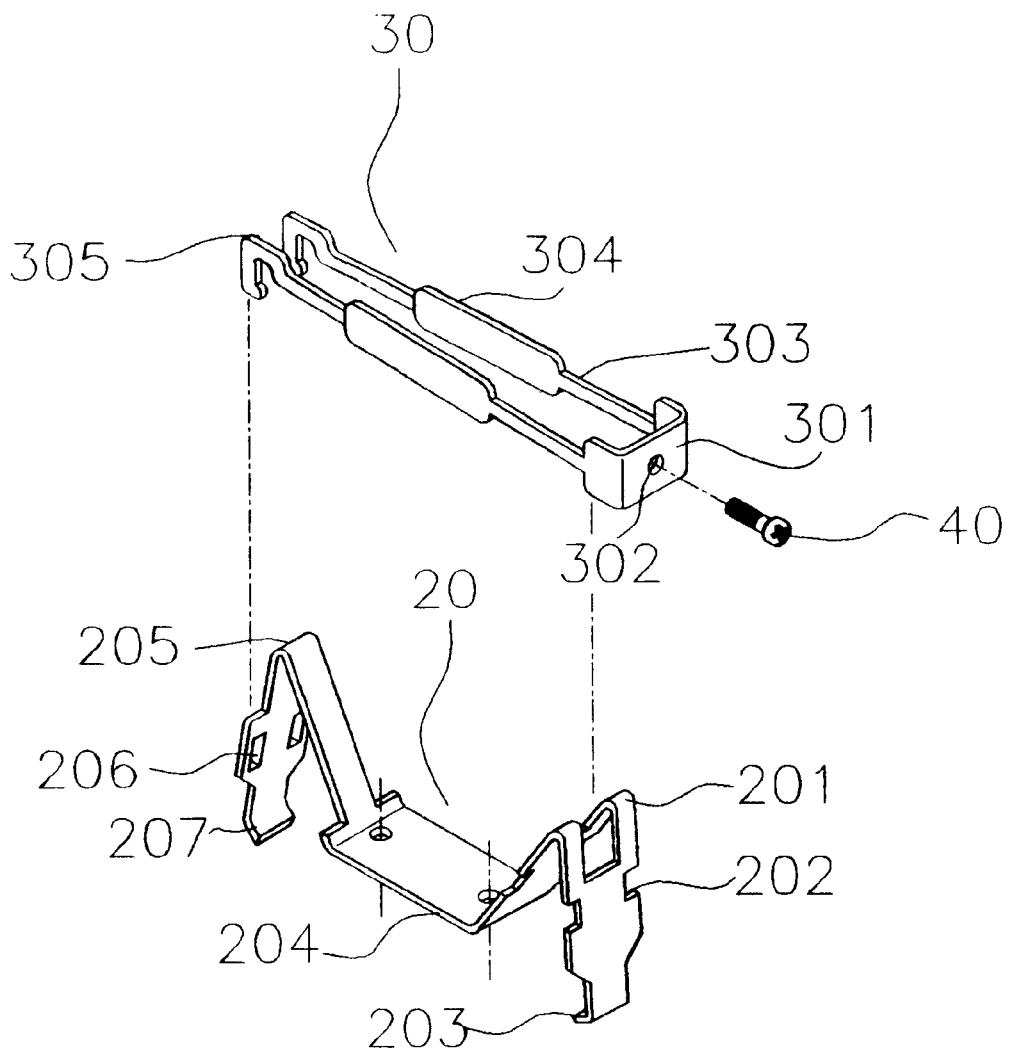
FIG. 3 is an exploded drawing of the structural components of the invention herein.

Referring to FIG. 3, the heat dissipation device seating structure of the invention herein is comprised of a holddown component 20 and a lifter link component 30, wherein the two ends of the said holddown component 20 extend outward from a horizontal section 204; one end extends upward from the horizontal section 204 at an angle and is then bent downward vertically, a tensile catch seat 201 is formed at the bend, notch-like limiter sections 202 are formed in level juxtaposition on the two edges situated vertically below the catch seat 201, and an inward facing latch hook 203 is formed at the bottom end of the catch seat 201, while the other end extends upward from the horizontal section 204 at an angle and this physically narrower end is then bent downward vertically, a tensile hook seat 205 is formed at the bend, a pair of slots 206 are disposed in parallel in the hook seat 205, and an inward facing latch hook 207 is formed at the bottom of the hook seat 205; the lifter link component 30 is U-shaped and has an adjustment saddle 301 vertically formed on one end; a threaded hole 302 is tapped in the adjustment saddle 301 and forked adjustment arms 303 extend in parallel from the two sides; the front extent of the forked adjustment arms 303 fit into and are retained in position by the limiter sections 202, a reinforcing section 304 of broader width is formed along the center extent of the forked adjustment arms 303 to prevent the flexing when pressure is applied, and a curved shank hook 305 is formed at the bottom ends of each the forked adjustment arms 303 that provides for linking onto the hook seat 205 and engagement into the slots 206.

Figure 4:
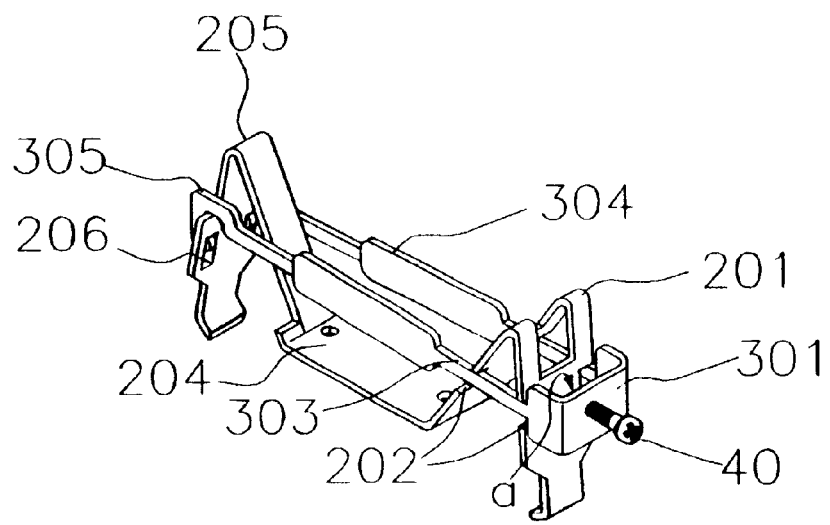
FIG. 4 is an isometric drawing of the assembly of the invention herein.

Referring to FIG. 4, when the invention herein is assembled for installation, the adjustment saddle 301 is positioned against the outer side of the catch seat 201, the bodies of the forked adjustment arms 303 are inserted and positioned in the limiter sections 202, and the curved shank hooks 305 at the bottom end coupled around the top end of the hook seat 205 and engaged in the slots 206, with the space a remaining in between the adjustment saddle 301 and the catch seat 201.

Figure 5:
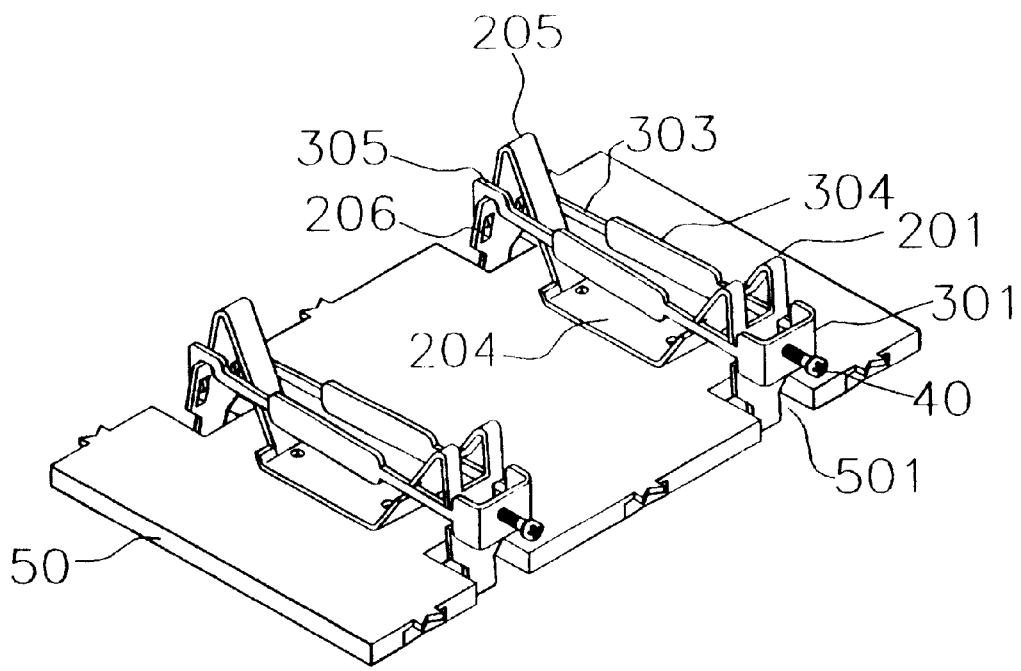
FIG. 5 is an isometric drawing of the invention herein as assembled to the base plate of the heat dissipation fixture.
Figure 6:
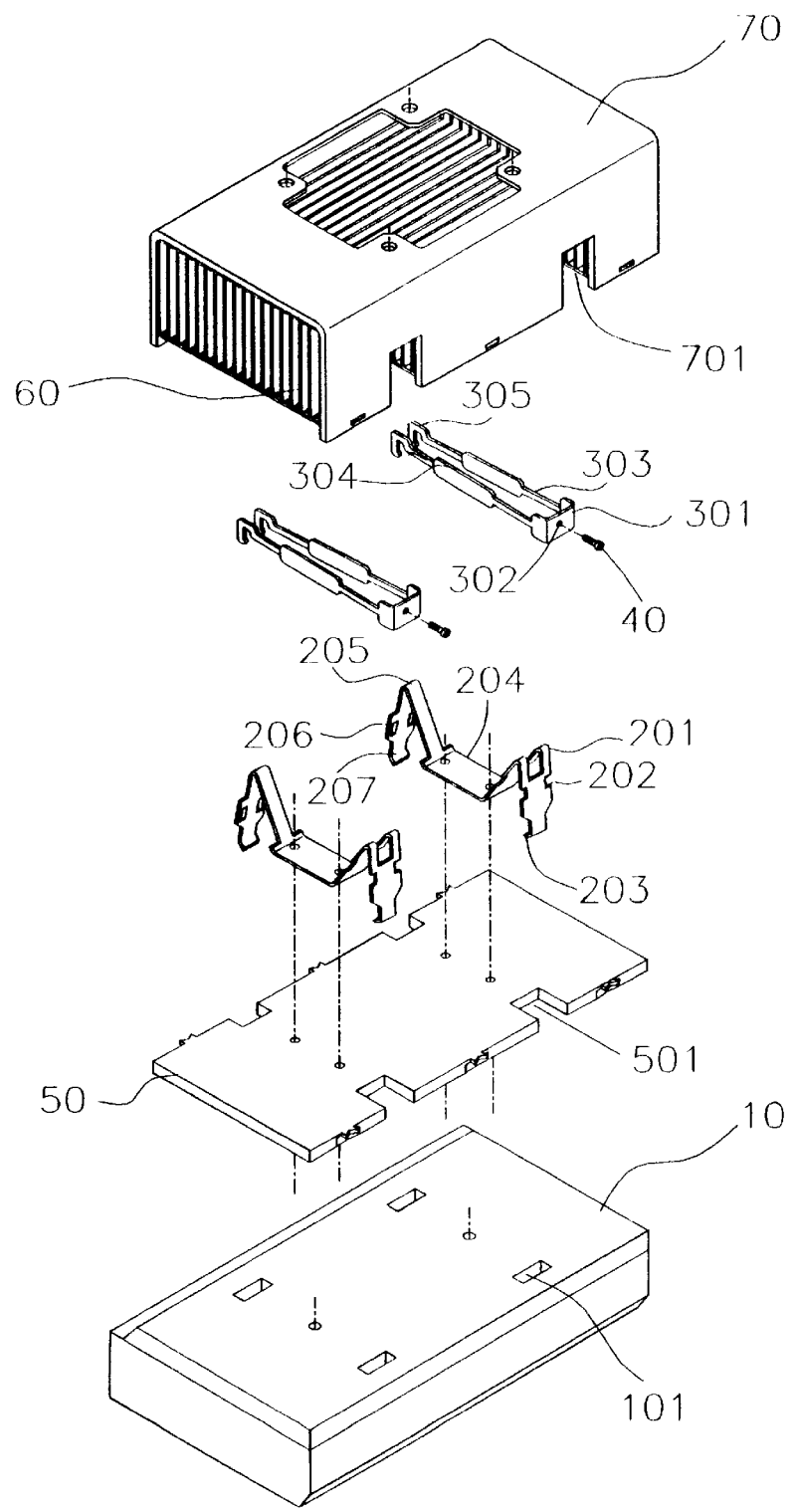
FIG. 6 is an exploded drawing of the invention herein and the heat dissipation fixture before installation onto the CPU.
Figure 7:
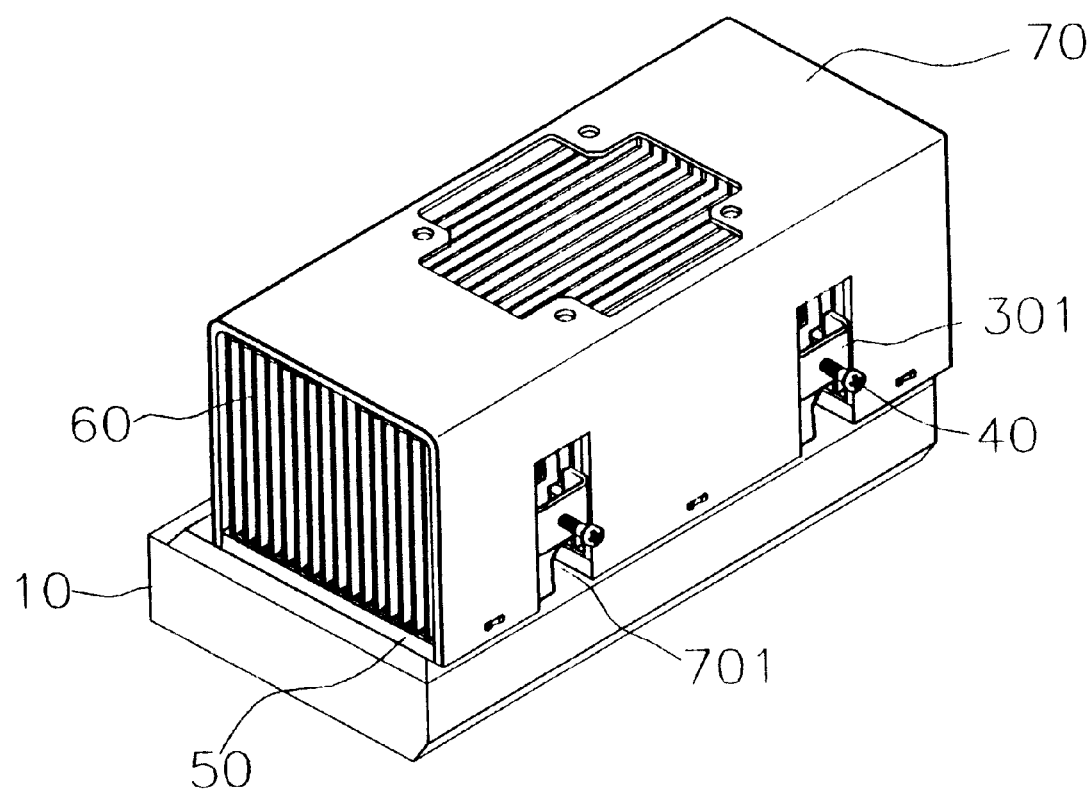
FIG. 7 is an isometric drawing of the invention herein and the heat dissipation fixture as installed onto the CPU.

Referring to FIG. 5, FIG. 6, and FIG. 7, through-holes 101 are pre-formed in the central processing unit (CPU) housing 10 to provide for the aligned fastening of the heat dissipation fixture; notched sections 501 are formed at appropriate positions along the two sides of the base plate 50 such that when the horizontal sections 204 of the holddown components 20 are placed flush against the base plate 50, the catch seats 201 and the hook seats 205 become vertically inserted, while the latch hook 203 and the latch hook 207 at the bottom ends are moved downward into the base plate 50 and, furthermore, into the through-holes 101 of the CPU housing 10; when the base plate 50, the heat sink 60, the holddown components 20, and the lifter link components 30 are assembled—in this respective order, the upper cover 70 is placed over the semi-finished assembly and finally, the latch hooks 203 and 207 are aligned with and inserted into the through-holes 101 of the CPU housing 10 to complete the assembly of the present invention; since the adjustment saddles 301 are of a vertically oriented design and, therefore, are positioned to allow access at the openings 701 in the exterior sides of the upper cover 70, the adjustment screws 40 can be loosened or tightened through the openings 701 of the upper cover 70 for purposes of assembly and disassembly.

Figure 8:
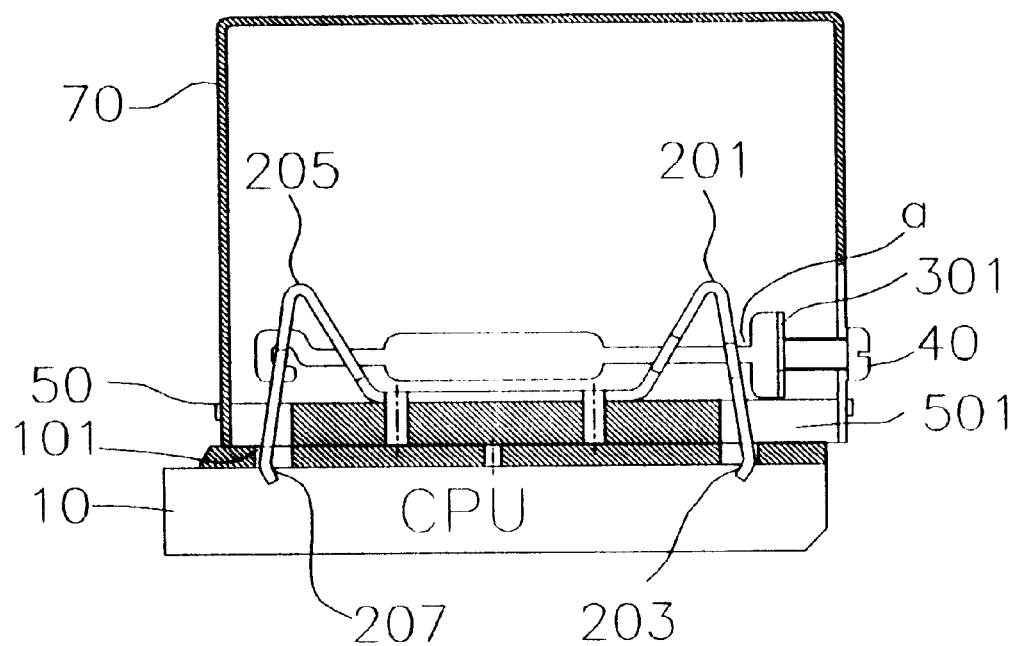
FIG. 8 is a cross-sectional drawing of the invention herein before tightening, as viewed from the lateral perspective of FIG. 7.

Referring to FIG. 8, before the adjustment screws 40 are rotated inward and tightened to apply pressure, a relatively small space a is present in between the adjustment saddles 301 and the catch seats 201, thereby enabling the penetration of the latch hooks 203 and 207 into the notched sections 501 of the base plate 50 as well as the aligned through-holes 101 of the CPU housing 10.

Figure 9:
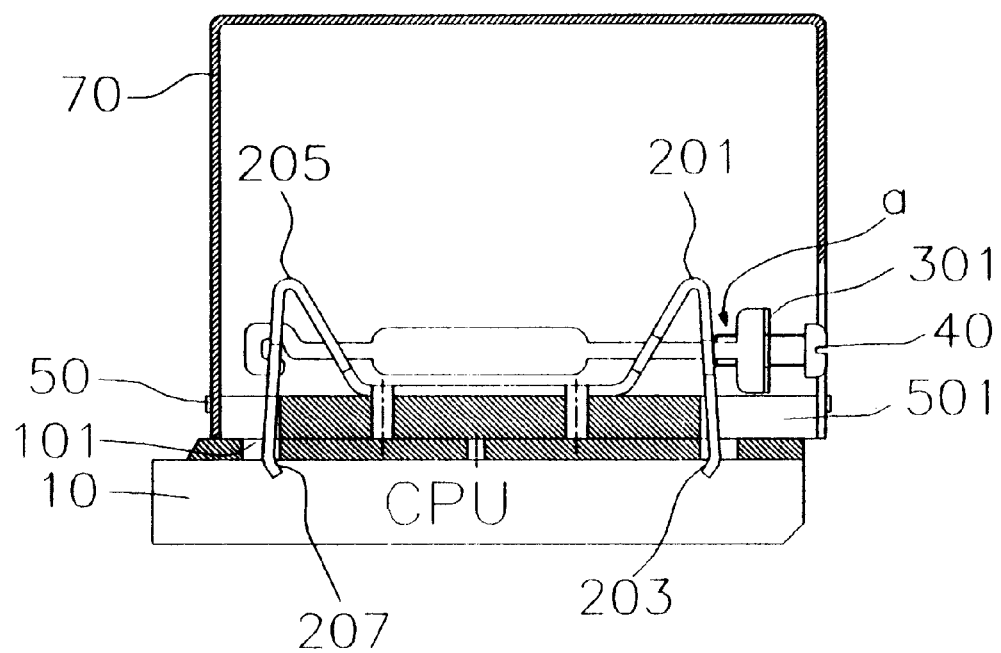
FIG. 9 is cross-sectional drawing of the invention herein after tightening, as viewed from the lateral perspective of FIG. 7.

Referring to FIG. 9, when the adjustment screws 40 are rotated inward and tightened to apply pressure, the spaces a in between each of the adjustment saddles 301 and the catch seats 201 become larger, while the catch seats 201 and the hook seats 205 clamp inward due to the exerted pressure, with the slant of their original vertical angles becoming more perpendicular as they move inward and thereby causing the latch hooks 203 and 207 to clasp against the interior lateral edge of the through-holes 101, resulting in an upward supporting force that significant increases the degree of conjunctive contact between the base plate 50 and the CPU housing 10.

Since the seating structure of the invention herein is contained within the heat dissipation fixture, it is highly safe and stable, while also capable of being assembled and disassembled by utilizing an externally accessible adjustment screw, which provides for greater convenience and practicality.

In summation of the foregoing section, since the heat dissipation fixture seating structure of the invention here provides an original and practical means of securing a heat dissipation fixture which not only effectively improves upon the numerous installation and removal inconveniences of the prior art structures, but is an innovation of reasonable technical refinement and economical advantages.

What is claimed is:

1. A heat dissipation fixture seating structure for mounting a heat dissipation fixture and comprising:
   a) a central processing unit (CPU) housing having a surface with at least two through holes;
   b) a base plate having at least two notched sections, the base plate located on the surface of the CPU housing such that the at least two notched sections are aligned with the at least two through holes;

c) at least one hold down having: a first section located on the base plate, the first section having two opposite ends; a catch seat having an inverted V-shaped configuration with a first leg extending from a first of the two opposite ends of the first section, and a second leg having a first inward latch hook thereon and a notched limiter section; and a hook seat having an inverted V-shaped configuration with a third leg extending from a second of the two opposite ends of the first section, and a fourth leg having a pair of slots and a second inward latch hook, the second and fourth legs extending through the notched sections of the base plate and the through holes of the CPU housing;

d) at least one lifter link having an adjustment saddle with two adjustment arms extending therefrom, the adjustment arms extending through the notched limiter sections and having shank hooks thereon engaging the pair of slots; and, e) a threaded member threaded into and extending through the adjustment saddle into contact with the catch seat such that rotation of the threaded member causes deflection of the second and fourth legs toward each other, thereby urging the first and second inward latch hooks to clasp the CPU housing.

2. The heat dissipation fixture seating structure of claim 1 further comprising a heat sink having an outer cover with a side portion having at least an access opening therein aligned with the threaded members enabling access to the threaded member from exteriorly of the outer cover.

* * * * *